(12) United States Patent
Takata

(10) Patent No.: US 6,501,319 B2
(45) Date of Patent: Dec. 31, 2002

(54) SEMICONDUCTOR DEVICE WITH SIGNAL TRANSFER LINE

(75) Inventor: Hidehiro Takata, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/804,379

(22) Filed: Mar. 13, 2001

(65) Prior Publication Data

US 2002/0005747 A1 Jan. 17, 2002

(30) Foreign Application Priority Data

Jul. 11, 2000 (JP) .................................. 2000-209754

(51) Int. Cl.[7] .............................................. H03K 5/08
(52) U.S. Cl. ...................... 327/310; 327/313; 327/314; 327/318
(58) Field of Search ................. 327/108, 319, 327/384, 309, 310, 313, 314, 318–321, 324, 325, 327, 328; 326/83, 86, 26, 27

(56) References Cited

U.S. PATENT DOCUMENTS

| 4,853,560 | A | * | 8/1989 | Iwamura et al. ............... 327/86 |
| 4,858,055 | A | * | 8/1989 | Okitaka ........................ 327/313 |
| 5,289,054 | A | * | 2/1994 | Lucas .......................... 327/328 |
| 6,333,661 | B1 | * | 12/2001 | Ando et al. .................. 327/313 |

FOREIGN PATENT DOCUMENTS

JP       4-129318       4/1992

* cited by examiner

*Primary Examiner*—Terry D. Cunningham
*Assistant Examiner*—Long Nguyen
(74) *Attorney, Agent, or Firm*—McDermott, Will & Emery

(57) ABSTRACT

A noise limiter of a semiconductor integrated circuit device includes a diode-connected N channel MOS transistor between a bus line and a line of a potential lower than the power supply potential by a threshold voltage, and a diode-connected P channel MOS transistor between a line of a potential higher than the ground potential by a threshold voltage and the bus line. The potential of the bus line is limited between the level of the power supply potential and the ground potential, so that the noise level of the bus line is reduced.

8 Claims, 9 Drawing Sheets

SEMICONDUCTOR DEVICE WITH SIGNAL TRANSFER LINE

BACKGROUND OF THE INVENTION

1. Field of the Invention

The present invention relates to semiconductor devices, and more particularly to a semiconductor device with a signal transfer line.

2. Description of the Background Art

FIG. 11 is a block diagram showing a main part of a conventional semiconductor integrated circuit device.

Referring to FIG. 11, the semiconductor integrated circuit device includes a bus 30, a transmission side circuit 31 connected to one end of bus 30, and a reception side circuit 32 connected to the other end of bus 30. Bus 30 includes N (N is an integer of at least 2) bus lines L1–LN.

Signals VO1–VON output from transmission side circuit 31 are transferred to reception side circuit 32 via bus lines L1–LN, respectively. Reception side circuit 32 responds to signals VO1–VON to carry out a predetermined operation.

FIG. 12 shows the semiconductor integrated circuit device of FIG. 11 in more detail. In FIG. 12, only the four adjacent bus lines Ln−1~Ln+2 out of the N bus lines L1–LN and components corresponding thereto are depicted.

Referring to FIG. 12, four drivers 33 are provided corresponding to four bus lines Ln−1~Ln+2, respectively, at reception side circuit 31. The four drivers 33 are rendered active in response to a driver control signal/E attaining an activation level of "L" to provide signals VOn−1~VOn+2 having levels identical to those of internal signals VIn−1~VIn+2 to one ends of bus lines Ln−1~Ln+2.

Each of bus lines Ln−1~Ln+2 has a line resistance R and a inter-line capacitance C of values determined by the line length, line width, and the like. Signals VOn−1~VOn+2 applied to one ends of bus lines Ln−1~Ln+2 are transmitted to the other ends of bus lines Ln−1~Ln+2.

Four receivers 34 are provided corresponding to four bus lines Ln−1~Ln+2 at reception side circuit 32. The four receivers 34 detect whether the potentials at the other ends of bus lines Ln−1~Ln+2 are higher or lower than the reference potential, and reproduces signals VIn−1~VIn+2 according to the detected result. Reception side circuit 32 carries out a predetermined operation according to the reproduced signals VIn−1~VIn+2.

In such a semiconductor integrated circuit device, the occupation ratio of inter-line capacitance C as to the capacitance of the wiring is increasing according to the microminiaturization of the process. For example, in the 0.15 $\mu$m process, inter-line capacitance C corresponds to 90% of the capacitance of the wiling, whereas the remaining 10% corresponds to the line-substrate capacitance, fringe capacitance, and the like. In a semiconductor integrated circuit device, coupling noise by interline capacitance C has become problematic.

For example, when signal VIn is driven from an L level to an H level or from an H level to an L level under the state where signal VIn+1 is held at an H level or an L level in FIG. 12, the level of signal VOn+1 will be altered by the coupling noise.

More specifically, in the case where signal VIn is driven from an L level to an H level when signal VOn+1 is at an H level as shown in FIG. 13, signal VOn+1 rises in a pulsive manner (this noise is referred to as "coupling noise 1" hereinafter). In the case where signal VIn is driven to an L level from an H level when signal VOn+1 is at an L level, signal VOn+1 is reduced in a pulsive manner (this noise is referred to as "coupling noise 2").

In the case where signal VIn is pulled down to an L level from an H level when signal VOn+1 is at an H level, signal VOn+1 is reduced in a pulsive manner (this noise is referred to as "coupling noise 3" hereinafter). In the case where signal VIn is pulled up to an H level from an L level when signal VOn+1 is at an L level, signal VOn+1 rises in a pulsive manner (this noise is referred to as "coupling noise 4" hereinafter).

Coupling noises 1 and 2 among the above-described noises will delay the level change of signal VOn+1 when signal VOn+1 is altered in opposite phase to signal VOn, whereby the operating speed of the semiconductor integrated circuit is reduced. Also, coupling noises 3 and 4 cause receiver 34 to operate erroneously when signal VOn+1 attains a large noise that exceeds the reference potential of receiver 34.

These problems have been dealt by setting the line intervals of bus lines L1–LN as wide as possible. However, bus lines L1–LN cannot enjoy the advantages of process microminiaturization with this measure. In microprocessors, memories, and the like, the amount of data to be processed at one time is increasing from 32 bits to 64 bits, and further to 128 bits corresponding to the requirement of high speed processing. As a result, the number N of bus lines L1–LN is also increasing. Therefore, increasing the interval of bus lines L1–LN is not preferable since the layout area will be increased.

SUMMARY OF THE INVENTION

In view of the foregoing, a main object of the present invention is to provide a semiconductor device of small layout area and low noise level.

According to an aspect of the present invention, a semiconductor device includes a driver having an output node connected to one end of a signal transfer line, driving the output node to a first potential in response to a first signal and to a second potential differing from the first potential in response to a second signal, and a noise limiter with a first diode element having a first electrode receiving a third potential corresponding to the first potential shifted in level towards the second potential side by a threshold voltage, and a second electrode connected to the signal transfer line, and rendered conductive in response to the potential of the signal transfer line exceeding the first potential. When coupling noise 1 or 2 is generated at the signal transfer line so that the potential of the signal transfer line exceeds the first potential, the first diode is rendered conductive to restore the potential of the signal transfer line to the first potential. Therefore, the level of coupling noise 1 or 2 can be reduced. Also, only a small layout area is required since the interval of the signal transfer lines does not have to be increased.

Preferably, the noise limiter includes a second diode element having a first electrode receiving a fourth potential corresponding to the second potential shifted in level towards the first potential side by a threshold voltage, and a second electrode connected to the signal transfer line, rendered conductive in response to the potential of the signal transfer line exceeding the second potential. When coupling noise 2 or 1 is generated at the signal transfer line so that the potential of the signal transfer line exceeds the second potential, the second diode element is rendered conductive to restore the potential of the signal transfer line to the second potential. Therefore, coupling noise 2 or 1 can be reduced.

The semiconductor device preferably includes a receiver having an input node connected to the other end of the signal transfer line to receive first and second signals by detecting the potential of the input node. The noise limiter is connected to the signal transfer line at a connection node closer to the input node of the receiver than the output node of the driver. Since coupling noises 1 and 2 become larger as approaching the receiver, coupling noises 1 and 2 can be reduced effectively by connecting the noise limiter with the signal transmission line at an output point closer to the input node of the receiver than the output node of the driver.

The noise limiter is preferably provided in the proximity of the input node of the receiver. Since coupling noises 1 and 2 attain the maximum level in the proximity of the receiver, coupling noises 1 and 2 can be reduced effectively by providing the noise limiter in the proximity of the input node of the receiver.

The signal transfer line is preferably divided into a plurality of sub signal transfer lines. The semiconductor device further includes a signal transfer circuit provided between each of the plurality of sub signal transfer lines, having an input node connected to a sub signal transfer line located at an upstream side and an output node connected to a sub signal transfer line located at a downstream side to output a potential of a level identical to that of the input potential. The noise limiter is provided corresponding to each signal transfer circuit, and located in the proximity of the input node of a corresponding signal transfer circuit. In this case, coupling noises 1 and 2 can be reduced effectively even if the length of the signal transfer line is great.

Preferably, the signal transfer line is provided in plurality parallel to each other. The driver and noise limiter are provided corresponding to each signal transfer line. The semiconductor device further includes a delay circuit provided corresponding to one signal transfer line of every two adjacent signal transfer lines, connected between the output node of a corresponding driver and one end of a corresponding signal transfer line to delay the potential change by a predetermined time. In this case, the drive timing of two adjacent signal transfer lines can be shifted to reduce the influence of coupling noises 1 and 2.

Preferably, the signal transfer line is provided in plurality parallel to each other. The driver and noise limiter are provided corresponding to each signal transfer line. The semiconductor device further includes a control circuit to render active a driver corresponding to one signal transfer line out of each adjacent two signal transfer lines, and then rendering a driver corresponding to the other signal transfer line at an elapse of a predetermined time. In this case, the drive timing of two adjacent signal transfer lines can be shifted to reduce the influence of coupling noises 1 and 2.

Preferably, the first potential is the power supply potential, and the second potential is the ground potential. In this case, the level of coupling noises 1 and 2 that increases or reduces the potential of the signal transfer line higher than the power supply potential or lower than the ground potential can be reduced.

Preferably, the first potential is a potential higher than the power supply potential by the threshold voltage of the diode element, and the second potential is a potential lower than the ground potential by the threshold voltage of the diode element. In this case, the influence of coupling noises 3 and 4 can be reduced since the amplitude voltage of the signal transfer line is increased. Therefore, the margin in detecting the signal level of the signal transfer line can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIRST EMBODIMENT

Figure 1:
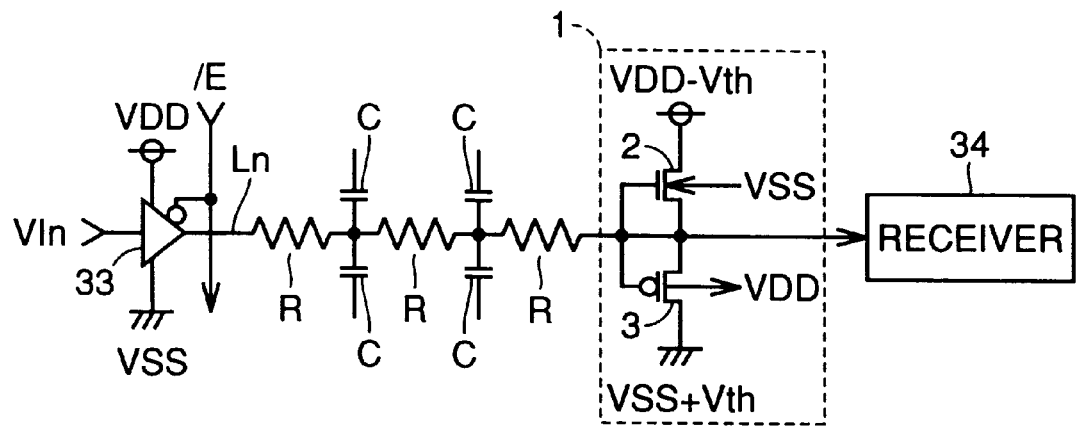
FIG. 1 is a circuit block diagram showing a main part of a semiconductor integrated circuit device according to a first embodiment of the present invention.
Figure 12:
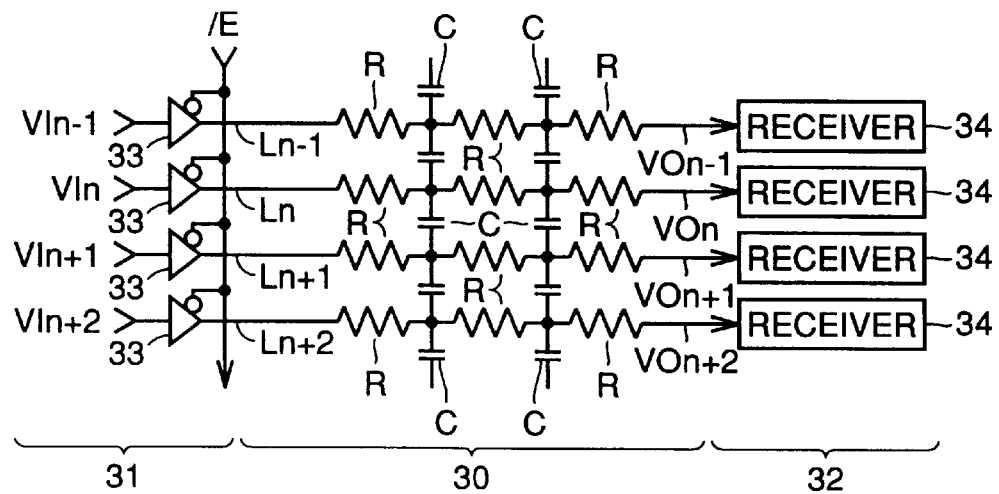
FIG. 12 is a circuit block diagram showing a main part of the semiconductor integrated circuit device of FIG. 11.

FIG. 1 is a circuit block diagram showing a main part of a semiconductor integrated circuit device according to a first embodiment of the present invention, comparable with FIG. 12. In FIG. 1, only the portion related to one bus line Ln is shown.

Referring to FIG. 1, the semiconductor integrated circuit device of the first embodiment differs from the conventional semiconductor integrated circuit device of FIG. 12 in that a noise limiter 1 is provided for each of bus lines L1–LN. Noise limiter 1 is provided in the proximity of an input node of a receiver 34, and includes an N channel MOS transistor 2 and a P channel MOS transistor 3.

N channel MOS transistor 2 has its source receiving a potential VDD–Vth that is lower than power supply potential VDD by a threshold voltage Vth, a gate and drain connected to bus line Ln, and a substrate receiving ground potential VSS.

P channel MOS transistor 2 has a source receiving a potential VSS+Vth higher than ground potential VSS by threshold voltage Vth, a gate and drain connected to bus line Ln, and a substrate receiving power supply potential VDD.

Driver 33 includes a P channel MOS transistor connected between the line of power supply potential VDD and one end of bus line Ln, rendered conductive in response to signal VIn attaining an H level, and an N channel MOS transistor connected between the line of ground potential VSS and one end of bus line Ln, rendered conductive in response to signal VIn attaining an L level. Therefore, bus line Ln is driven between power supply potential VDD and ground potential VSS.

Figure 13:
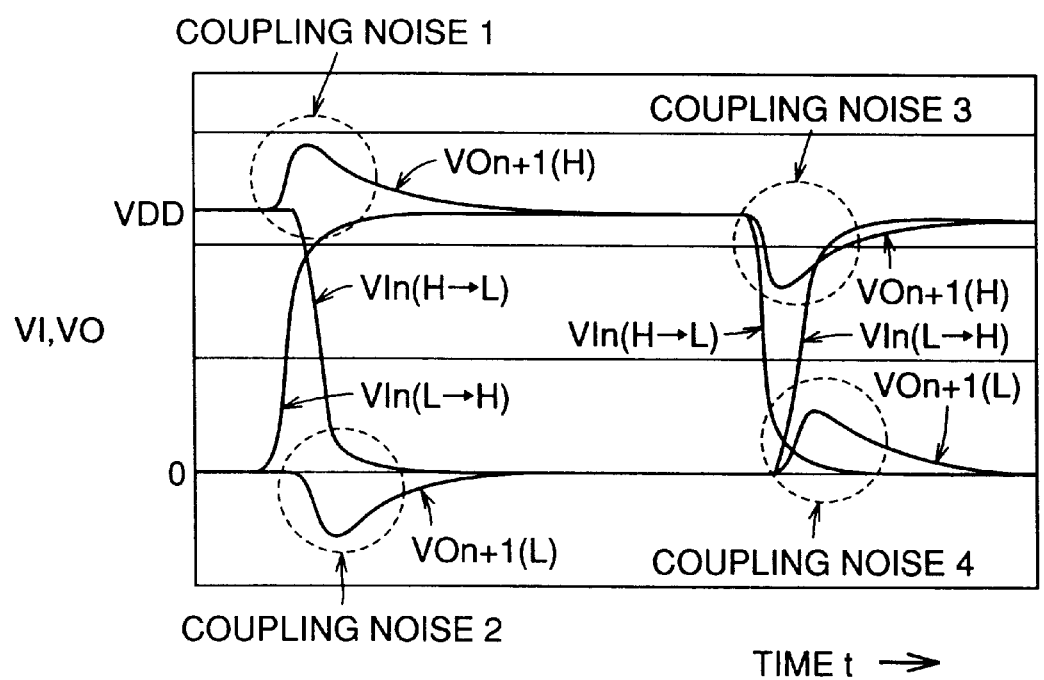
FIG. 13 is a diagram to describe problems of the semiconductor integrated circuit device of FIG. 11.

The operation of this semiconductor integrated circuit device will be described in further detail. In response to driver control signal/E attaining an activation level of L, driver 33 drives bus line Ln. At this stage, coupling noises 1–4 described with reference to FIG. 13 are generated in response to the level change of adjacent bus lines Ln−1 and Ln+1. The noise is greatest in the proximity of receiver 34. Noise limiter 1 functions to reduce coupling noise 1 overshooting power supply potential VDD and coupling noise 2 undershooting ground potential VSS among coupling noises 1–4.

Consider the case where coupling noise 1 is generated. VSS+Vth is applied to the source of P channel MOS transistor 3. Coupling noise 1 is a noise that overshoots power supply potential VDD. Therefore, P channel MOS transistor 3 constantly is at a nonconductive state, and does not contribute to coupling noise 1. Thus, P channel MOS transistor 3 is omitted from consideration.

N channel MOS transistor 2 has a substrate potential of ground potential VSS, a source receiving potential VDD−Vth lower than power supply potential VDD by threshold voltage Vth, and a gate and drain connected to bus line Ln. Therefore, N channel MOS transistor 2 is not rendered conductive until the potential of bus line Ln becomes higher than source potential VDD−Vth by a threshold voltage Vth, i.e. higher than VDD−Vth+Vth=VDD. When coupling noise 1 overshooting power supply potential VDD is generated at bus line Ln, N channel MOS transistor 2 is rendered conductive, whereby current flows from the chain to the source to reduce the level of coupling noise 1.

Although the noise removal effect becomes greater as the potential applied to the source of N channel MOS transistor 2 becomes lower than power supply potential VDD, that potential applied to the source thereof should not be lower than VDD−Vth since steady current will flow under the state where bus line Ln attains an H level. Therefore, the potential applied to the source of N channel MOS transistor 2 is preferably at a level as low as possible equal to or above VDD−Vth. In other words, the potential applied to the source of N channel MOS transistor 2 is most preferably VDD−Vth. A potential of VDD−Vth can be easily generated by providing a source potential utilizing the level shift by a transistor. Thus, setting the source potential to VDD−Vth is most preferable from the standpoint of potential generation.

Next, consider the case of generation of coupling noise 2. VDD−Vth is supplied to the source of N channel MOS transistor 2. Coupling noise 2 is a noise undershooting ground potential VSS. Therefore, N channel MOS transistor 2 constantly attains a nonconductive state, and does not contribute to coupling noise 2. Therefore, N channel MOS transistor 2 is removed from consideration.

P channel MOS transistor 3 has a substrate potential of power supply potential VDD, and a source receiving a potential VSS+Vth higher than ground potential VSS by threshold voltage Vth, and a gate and drain connected. Therefore, P channel MOS transistor 3 is not rendered conductive until the potential bus line Ln becomes lower than source potential VSS+Vth by threshold voltage Vth, i.e. lower than VSS+Vth−Vth=VSS. However, when coupling noise 2 undershooting ground potential VSS is generated at bus line Ln, P channel MOS transistor 3 is rendered conductive, whereby current flows from the drain to source. As a result, the level of coupling noise 2 is reduced.

Although the noise removal effect becomes higher as the potential applied to the source of P channel MOS transistor 3 becomes higher than ground potential VSS, a potential thereof higher than VSS+Vth is not preferable since a steady current will flow under the state where bus line Ln is at an L level. Therefore, the potential applied to the source of P channel MOS transistor 3 is preferably a potential as high as possible equal to or below VSS+Vth. More specifically, the potential applied to the source of P channel MOS transistor 3 is most preferably VSS+Vth. The potential of VSS+Vth can be easily generated by generating a source potential utilizing level shifting by a transistor. Thus, setting the source potential to VSS+Vth is most desirable from the standpoint of potential generation.

In the first embodiment, noise limiter 1 is connected to bus line Ln at a connection point closer to the input node of receiver 34 than the output node of driver 33. Most preferably, N channel MOS transistor 2 and P channel MOS transistor 3 are connected in the proximity of the node input of receiver 34. Connection in the proximity of receiver 34 exhibits the greatest effect since coupling noises 1 and 2 become larger as approaching receiver 34. However, MOS transistors 2 and 3 can be connected at the center portion of bus line Ln or in the proximity of the output node of driver 33 since the removal effect of coupling noises 1 and 2 is exhibited even if MOS transistors 2 and 3 are connected at a position other than the proximity of receiver 34.

A structure of connecting MOS transistors 2 and 3 at each of a plurality of sites such as in the proximity of driver 33, at the center portion of bus line Ln, in the proximity of receiver 34, and the like is also advantageous in reducing coupling noises 1 and 2.

SECOND EMBODIMENT

Figure 2:
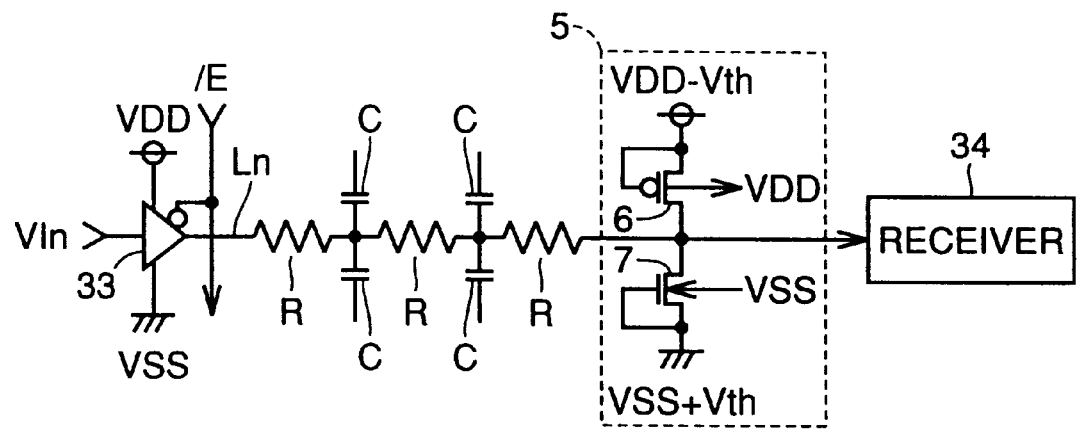
FIG. 2 is a circuit block diagram showing a main part of a semiconductor integrated circuit device according to a second embodiment of the present invention.

FIG. 2 is circuit block diagram showing a main part of a semiconductor integrated circuit device according to a second embodiment of the present invention, comparable with FIG. 2. In FIG. 2, only the portion related to one bus line Ln is shown.

Referring to FIG. 2, the semiconductor integrated circuit device of the second embodiment differs from the conventional semiconductor integrated circuit device in that a noise limiter 1 is provided at each of bus lines L1–LN. A noise limiter 5 is provided in the proximity of the input node of receiver 34, and includes a P channel MOS transistor 6 and an N channel MOS transistor 7.

P channel MOS transit 6 has a source and gate receiving VDD−Vth lower than power supply potential VDD by threshold voltage Vth, a drain connected to bus line Ln, and a substrate receiving power supply potential VDD.

N channel MOS transistor 7 has a source and gate receiving potential VSS+Vth higher than ground potential VSS by threshold voltage Vth, a drain connected to bus line Ln, and a substrate receiving ground potential VSS.

The operation of the semiconductor integrated circuit device will be described in detail hereinafter. When driver control signal/E attains an activation level of L, driver 33 drives bus line Ln. At this stage, the levels of adjacent bus lines Ln−1 and Ln+1 change to cause generation of coupling noises 1–4 described at FIG. 13. These noises are largest in the proximity of receiver 34. Noise limiter 5 functions to reduce coupling noise 1 overshooting power supply potential VDD and coupling noise 2 undershooting ground potential VSS among coupling noises 1–4.

First, the case of generating coupling noise 1 is considered. VSS+Vth is applied to N channel MOS transistor 7. Coupling noise 1 is a noise overshooting power supply potential VDD. Therefore, N channel MOS transistor 7 constantly attains a nonconductive state, and does not contribute to coupling noise 1. Therefore, N channel MOS transistor 7 is removed from consideration.

P channel MOS transistor 6 has a substrate potential of power supply potential VDD, a source and gate supplied with VDD−Vth, and a drain connected to bus line Ln. Therefore, P channel MOS transistor 6 is not rendered conductive until the potential of bus line Ln becomes higher than VDD−Vth by threshold voltage Vth, i.e., higher than VDD−Vth+Vth=VDD. However, P channel MOS transistor 6 conducts when coupling noise 1 overshooting power supply potential VDD is generated at bus line Ln, whereby current flows from the drain to source to reduce coupling noise 1.

Although the noise removal effect becomes greater as the potential applied to the source of P channel MOS transistor 6 becomes lower than power supply potential VDD, a potential lower than VDD−Vth is not preferable since a steady current will flow in a state where bus line Ln is at an H level. Therefore, the potential applied to the source of P channel MOS transistor 6 is preferably as low as possible, equal to or above VDD−Vth. More specifically, the potential applied to the source of P channel MOS transistor 6 is most preferably VDD−Vth. Since potential VDD−Vth can be easily generated by generating a source potential utilizing level shifting by a transistor, setting the source potential to VDD−Vth is most desirable from the standpoint of potential generation.

Next, consider the case of generation of coupling noise 2. VDD−Vth is applied to the gate and source of P channel MOS transistor 6. Coupling noise 2 is a noise undershooting ground potential VSS. Since P channel MOS transistor 6 constantly attains a nonconductive state and does not contribute to coupling noise 2, P channel MOS transistor 6 is excluded from consideration.

N channel MOS transit 7 has substrate potential of ground potential level VSS, a source and gate supplied with VSS+Vth, and a drain connected to bus line Ln. Therefore, N channel MOS transistor 7 is not rendered conductive until the potential of bus line Ln becomes lower than VSS+Vth by threshold voltage Vth, i.e., VSS+Vth−Vth=VSS. However, N channel MOS transistor 7 conducts when coupling noise 2 undershooting ground potential VSS is generated at bus line Ln, so that current flows from the drain to source to reduce coupling noise 2.

Although the noise removal effect becomes greater as the potential applied to the source of N channel MOS transistor 7 becomes higher than ground potential VSS, a potential higher than VSS+Vth is not preferable since a steady current will flow in a state where bus line Ln is at an L level. Therefore, the potential applied to the source of N channel MOS transistor 7 is preferably a potential as high as possible equal to or below VSS+Vth. More specifically, the potential applied to the source of N channel MOS transistor 7 is MOS preferably VSS+Vth. Since VSS+Vth can be easily generated by generating a source potential utilizing level shifting by a transistor, setting the source potential to VSS+Vth is most desirable from the standpoint of potential generation.

In the second embodiment, P channel MOS transistor 6 and N channel MOS transistor 7 are connected in the proximity of the input node of receiver 34. This connection is most effective since coupling noises 1 and 2 are greatest in the proximity of receiver 34. However, the removal effect with respect to coupling noises 1 and 2 is exhibited even if MOS transistors 6 and 7 are coupled at a position other than the proximity of receiver 34. Therefore, MOS transistors 6 and 7 can be connected at the center portion of bus line Ln or in the proximity of the output node of driver 33.

Also, a structure of coupling MOS transistors 6 and 7 at each of a plurality of sites such as in the proximity of driver 33, at the center portion of bus line Ln, in the proximity of receiver 34, and the like is effective in reducing coupling noise 1.

Figure 3:
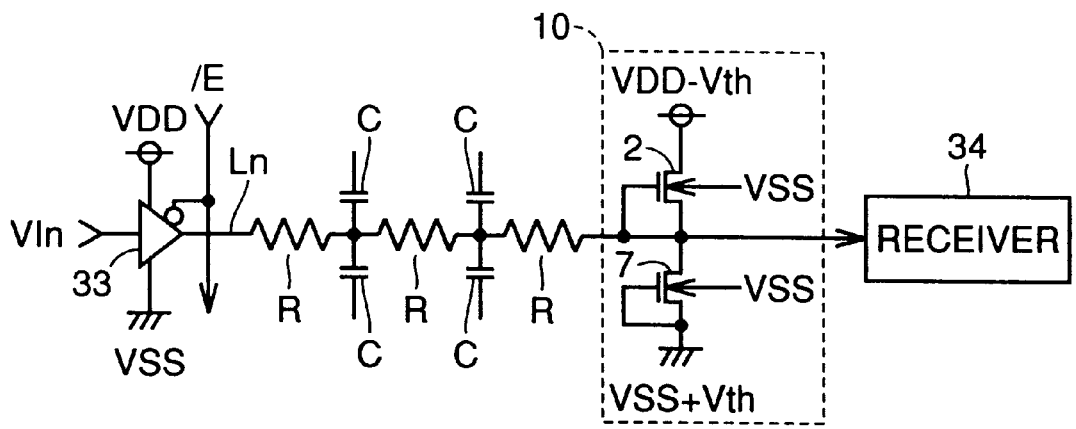
FIGS. 3, 4, 5, 6, 7 and 8 are circuit block diagrams showing modifications of the second embodiment.

Various modifications of the second embodiment will be described hereinafter. Referring to FIG. 3, a noise limiter 10 has diode-connected P channel MOS transistor 6 of noise limiter 5 shown in FIG. 2 replaced with diode-connected N channel MOS transistor 2 of FIG. 1. In this modification, noise limiter 10 is formed of N channel MOS transistors 2 and 7 of the same conductivity type. Therefore, N channel MOS transistors 2 and 7 can be arranged in an adjacent manner on the semiconductor substrate. This means that only a small layout area is required. It is to be noted that an N channel MOS transistor generally has a drivability two times that of a P channel MOS transistor. This means that the gate width required to achieve noise reduction of the same level is half that of the P channel MOS transistor. Thus, the advantage of reducing the area can be expected. Furthermore, since the gate width of the transistor can be reduced, the gate and drain capacitance of N channel MOS transistor 2 connected to bus line Ln and also the drain capacitance of N channel MOS transistor 7 is reduced. Since the capacitance applied to bus line Ln is reduced, coupling noises 1 and 2 can be reduced without degrading the bus operating speed.

Figure 4:
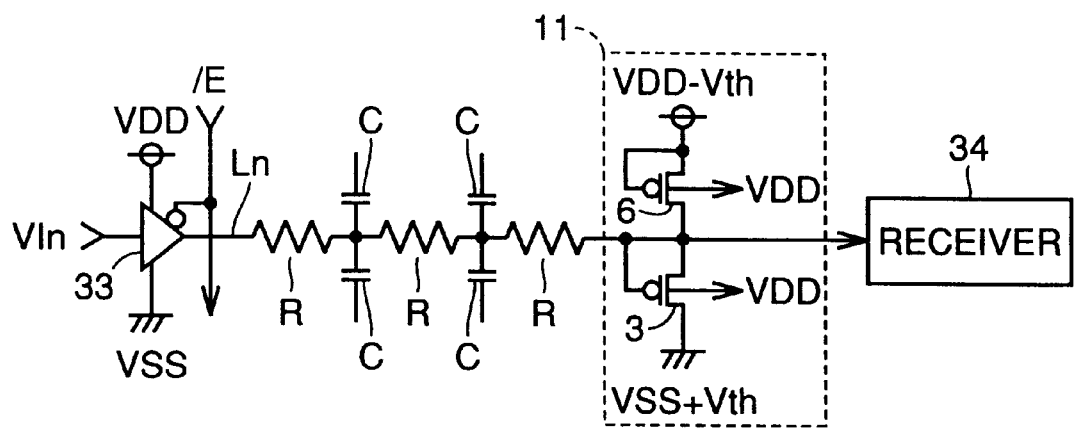

Referring to FIG. 4, a noise limiter 11 has diode-connected N channel MOS transistor 7 of noise limiter 5 of FIG. 2 replaced with diode-connected N channel MOS transistor 3 of FIG. 1. In this modification, noise limiter 11 is formed of only P channel MOS transistors 3 and 6 of the same conductivity type. Therefore, P channel MOS transistors 3 and 6 can be arranged in an adjacent manner on the semiconductor substrate, requiring only a small layout area.

Figure 5:
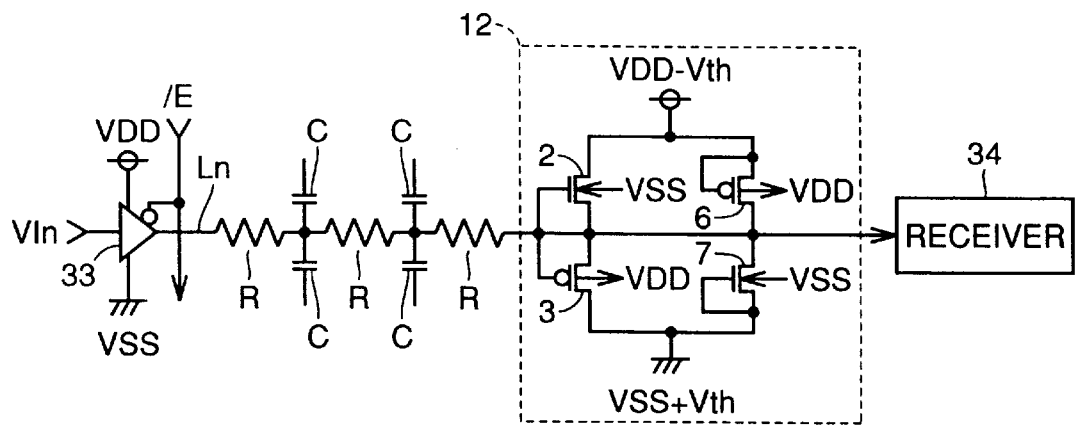

Referring to FIG. 5, a noise limiter 12 is a combination of noise limiter 1 of FIG. 1 and noise limiter 5 of FIG. 2. In this modification, four diode-connected MOS transistors are provided. Therefore, a larger noise reduction effect can be achieved.

Figure 6:
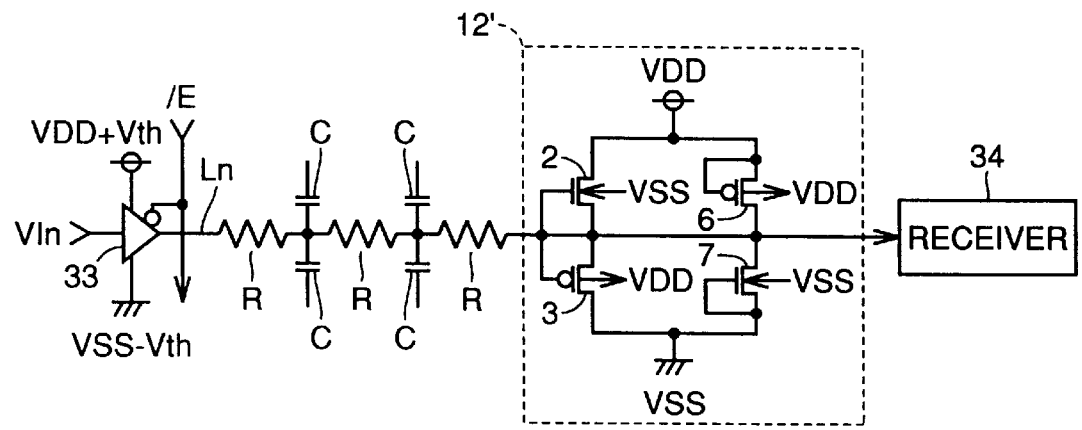

In the semiconductor integrated circuit device of FIG. 6, boosted potential VDD+Vth is applied to the source of the P channel MOS transistor of driver 33, and down-converted voltage VSS−Vth is applied to the source of the N channel MOS transistor of driver 33. Power supply potential VDD is applied to the source of the N channel MOS transistor and the drain of the P channel MOS transistor of a noise limiter 12', and ground potential VSS is applied to the source of P channel MOS transistor 3 and the drain of N channel MOS transistor 7. Bus line Ln is driven between the levels of boosted potential VDD+Vth and down-converted potential VSS−Vth.

In this modification, coupling noise 1 overshooting boosted potential VDD+Vth and coupling noise 2 undershooting down-converted potential VSS−Vth is reduced at noise limiter 12'. Even if coupling noise 3 undershooting boosted potential VDD+Vth and coupling noise 4 overshooting down-converted potential VSS−Vth are generated, the margin with respect to the reference potential of receiver 30 is increased by Vth than the case where bus line Ln is driven between the levels of power supply potential VDD and ground potential VSS. Therefore, all coupling noises 1–4 are reduced by the modification.

Figure 7:
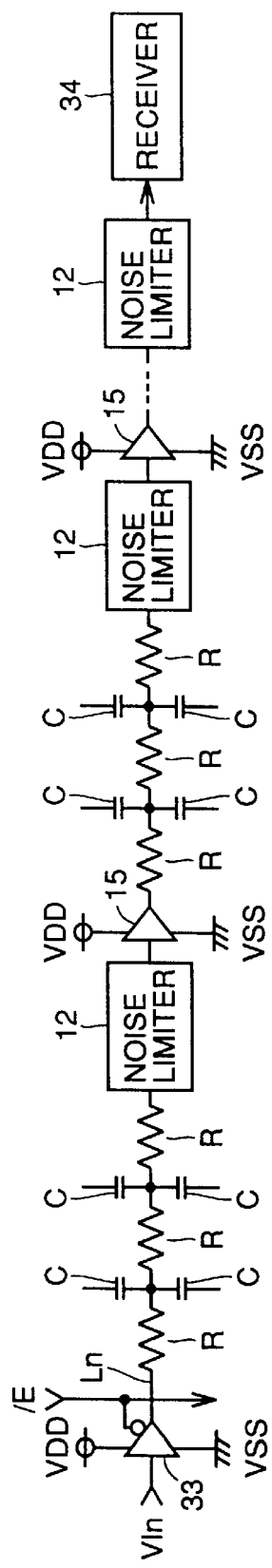

The semiconductor integrated circuit device of FIG. 7 has repeater 15 inserted at a plurality of sites of bus line Ln of FIG. 5, and a noise limiter 12 provided in the proximity of the input node of each repeater 15. Repeater 15 outputs power supply potential VDD in response to the input node exceeding the threshold potential level, and outputs ground potential VSS in response to the input node becoming lower than the threshold potential.

When bus line Ln has a great length, a plurality of repeaters 15 are provided in the passage of bus line Ln to support the drivability of driver 33. By virtue of repeater 15, the operating speed can be improved, the noise resistance can be increased by reduction of the transmission time of the signal level, and power consumption can be reduced by the lower through current. In the present modification, noise limiter 12 is connected in the proximity of the input node of repeater 15 in addition to the site in the proximity of receiver 34. Coupling noises 1 and 2 become greater as a function of length of the line, and also amplified by repeater 15. By connecting noise limiter 12 in the proximity of the input node of repeater 15, amplification of coupling noises 1 and 2 by repeater 15 can be reduced.

Any of noise limiters 1, 5, 10 and 11 shown in FIGS. 1–4 can be provided instead of noise limiter 12.

Figure 8:
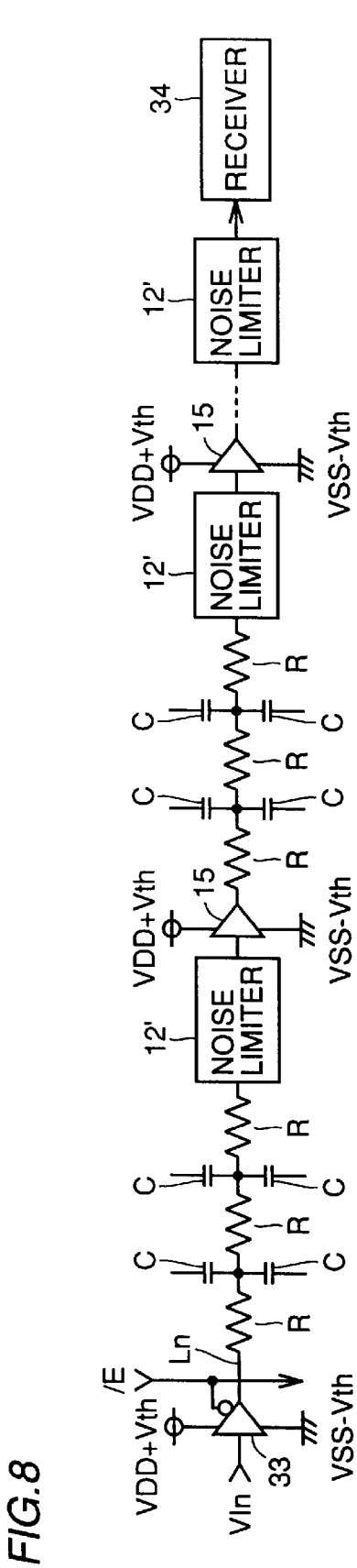

The semiconductor integrated circuit device of FIG. 8 has repeater 15 inserted at a plurality of sites of bus line Ln of FIG. 6, and a noise limiter 12' provided in the proximity of the input node of each repeater 15. Repeater 15 outputs boosted potential VDD−Vth in response to the input node exceeding the level of the threshold potential, and outputs down-converted potential VSS−Vth in response to the input node becoming lower than the level of the threshold potential. Coupling noises 1–4 are reduced by virtue of the present modification.

THIRD EMBODIMENT

Figure 9:
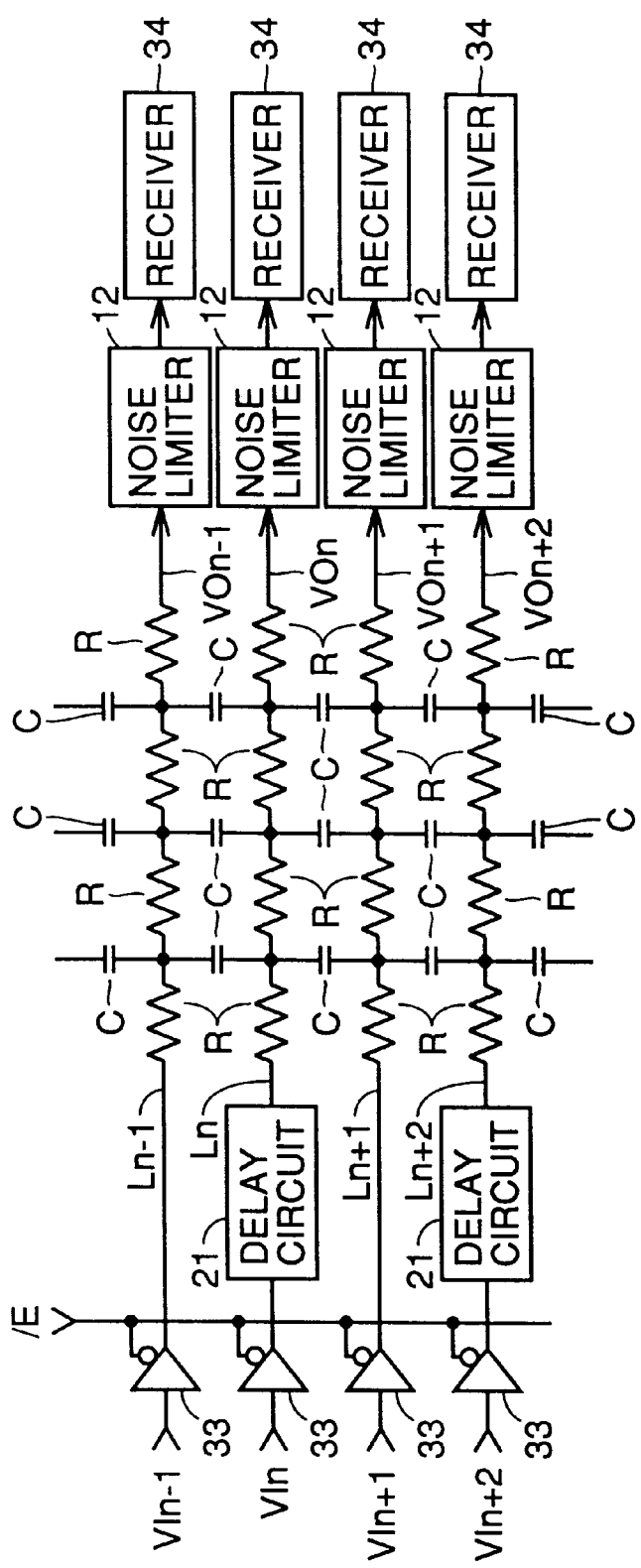
FIG. 9 is a circuit block diagram showing a main part of a semiconductor integrated circuit device according to a third embodiment of the present invention.

FIG. 9 is a circuit block diagram showing a main part of the semiconductor integrated circuit device according to a third embodiment of the present invention, comparable with FIG. 12.

Referring to FIG. 9, the semiconductor integrated circuit device differs from the semiconductor integrated circuit device of FIG. 12 in that noise limiter 12 is provided in the proximity of the input node of each receiver 34, and that delay circuits 21, 21 are provided at one bus lines Ln, Ln+2 of the two adjacent bus lines Ln−1 and Ln, and Ln+1 and Ln+2. Delay circuits 21, 21 are connected between respective output nodes of drivers 33, 33 and bus lines Ln, Ln+2.

Coupling noises 1 and 2 delay propagation of a signal in inverting the signal level. In the previous first and second embodiments, coupling noises 1 and 2 per se are reduced by the presence of a noise limiter in order to solve this problem. The present third embodiment is directed to reduce the influence of noises 1 and 2 on signal propagation by connecting delay circuit 21 to only one bus line out of the two adjacent bus lines and alter the transition timing of the signal level of the two buffer lines to shift the generation timings of coupling noises 1 and 2, in addition to the provision of a noise limiter.

Focusing on bus line Ln, for example, the driving timing of bus line Ln by driver 33 is after the elapse of the delay time by delay circuit 21 following the drive of adjacent bus lines Ln−1, Ln+1. Generation of coupling noises 1 and 2 at bus line Ln corresponds to the driving timing of adjacent bus lines Ln−1, Ln+1. Therefore, bus line Ln is driven subsequent to the elapse of the delay time by delay circuit 21 after generation of coupling noises 1 and 2. If coupling noises 1 and 2 can be eliminated during this period, bus line Ln can be driven without influence of coupling noises 1 and 2. As a result, there is no influence on propagation of signal VOn.

In this case, the influence of the delay time of delay circuit 21 on the propagation of signal VOn at bus line Ln may be of concern. However, the driving timing of bus lines Ln−1, Ln+1 adjacent to bus line Ln is altered by delay circuit 21, and coupling noises 1 and 2 are reduced by the noise limiter. Since coupling noises 1 and 2 generated at bus line Ln by the drive of bus lines Ln−1, Ln+1 can be eliminated promptly, the delay time of delay circuit 21 can be shortened significantly so that almost all the influence of delay circuit 21 on the propagation of signal VOn at bus line Ln can be eliminated.

Although noise limiter 12 is provided in the proximity of each receiver 34 in the third embodiment, noise limiter 1, 5, 10 or 11 can be provided instead of noise limiter 12.

Also, coupling noises 3 and 4 can be reduced by applying boosted potential VDD+Vth and down-converted potential VSS−Vth to the source of the P channel MOS transistor and the N channel MOS transistor, respectively, of driver 33, and replacing noise limiter 12 with noise limiter 12'.

Figure 10:
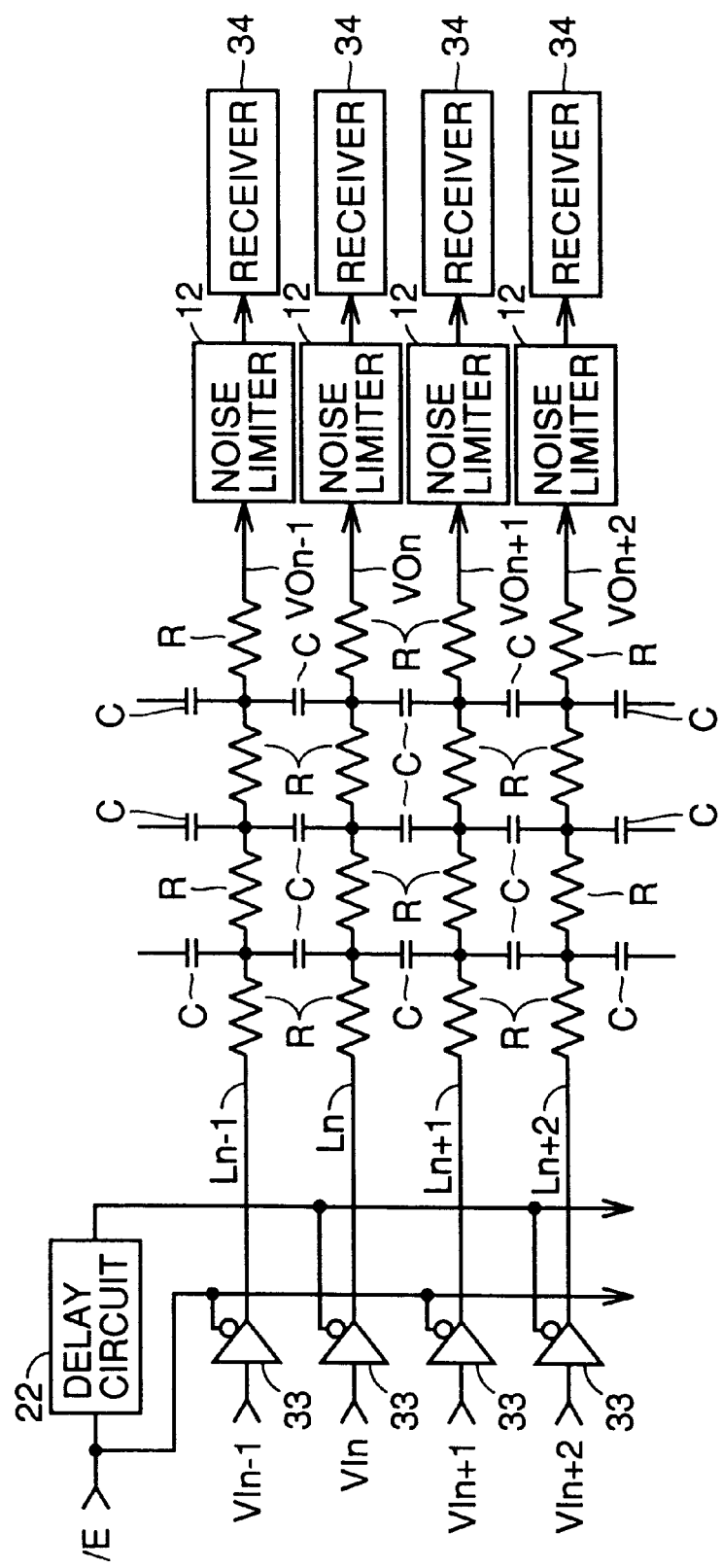
FIG. 10 is a circuit block diagram showing a modification of the third embodiment.
Figure 11:
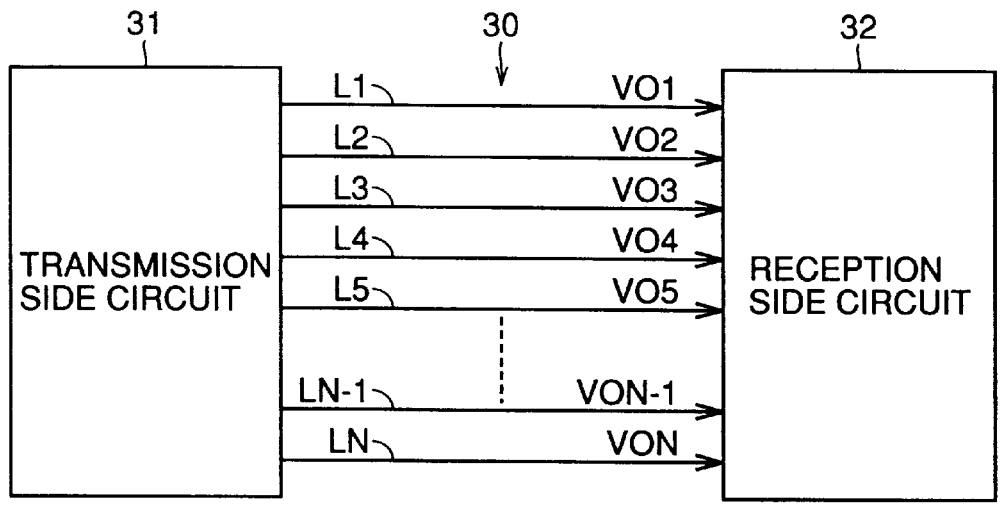
FIG. 11 is a block diagram showing a structure of a conventional semiconductor integrated circuit device.

FIG. 10 is a circuit block diagram showing a modification of the third embodiment, comparable with FIG. 12. Referring to FIG. 10, the semiconductor integrated circuit device differs from the semiconductor integrated circuit device of FIG. 12 in that noise limiter 12 is provided in the proximity of each receiver 34, and that delay circuit 22 is provided.

Driver control signal/E is directly applied to the control nodes of drivers 33, 33 corresponding to one bus lines Ln−1, Ln+1 out of two adjacent bus lines Ln−1 and Ln, and Ln+1 and Ln+2, as well as to the control nodes of drivers 33, 33 corresponding to the other bus lines Ln, Ln+2 via delay circuit 22. Therefore, the drive timing of bus lines Ln, Ln+2 is delayed from the driving timing of bus lines Ln−1, Ln+1 by the delay time of delay circuit 22. Therefore, the present modification provides the advantage of reducing the number of delay circuits 22 in addition to the advantage of the third embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a signal transfer line, comprising:
    a driver having an output node connected to one end of said signal transfer line to set said output node to a first potential in response to a first state of an input signal and to a second potential differing from said first potential in response to a second state of an input signal; and
    a noise limiter comprising:
        a first diode element having a first electrode receiving a third potential corresponding to said first potential shifted in level towards said second potential side by a threshold voltage corresponding to said first diode, and a second electrode connected to said signal transfer line, rendered conductive in response to the potential of said signal transfer line exceeding said first potential, and
        a second diode element having a first electrode receiving a fourth potential corresponding to said second potential shifted in level towards said first potential side by a threshold voltage corresponding to said second diode, and a second electrode connected to said signal transfer line, rendered conductive in response to the potential of said signal transfer line exceeding said second potential.

2. The semiconductor device according to claim 1, further comprising a receiver having an input node connected to the other end of said signal transfer line, and detecting the state of said input signal by detecting a potential of said input node, wherein said noise limiter is connected to said signal transfer line at a connection node closer to the input node of said receiver than the output node of said driver.

3. The semiconductor device according to claim 2, wherein said noise limiter is provided in close proximity to the input node of said receiver.

4. The semiconductor device according to claim 1, wherein said signal transfer line is divided into a plurality of sub signal transfer lines, said semiconductor device further comprising a signal transmission circuit provided between each of said plurality of sub signal transfer lines, having an input node connected to a sub signal transfer line located upstream, and an output node connected to a sub signal transfer line located downstream to output a potential of a level identical to the level of input potential, wherein said noise limiter is provided corresponding to each signal transmission circuit, and in close proximity to the input node of a corresponding signal transmission circuit.

5. The semiconductor device according to claim 1, wherein said signal transmission line is arranged in plurality, parallel to each other, wherein said driver and said noise limiter are provided corresponding to each signal transfer line, said semiconductor device further comprising a delay circuit provided corresponding to one signal transfer line out of each two adjacent signal transfer lines, connected between the output node of a corresponding driver and one end of a corresponding signal transfer line to delay a potential change by a predetermined time.

6. The semiconductor device according to claim 1, wherein said signal transmission line is arranged in plurality, parallel to each other, wherein said driver and said noise limiter are provided corresponding to each signal transfer line, said semiconductor device further comprising a control circuit rendering active a driver corresponding to one signal transfer line out of each two adjacent signal transfer lines subsequent to an elapse of a predetermined time after activation of a driver corresponding to the other signal transmission line.

7. The semiconductor device according to claim 1, wherein said first potential is a power supply potential, and said second potential is a ground potential.

8. The semiconductor device according to claim 1, wherein said first potential is a potential higher than the power supply potential by a threshold voltage of a diode element, and said second potential is a potential lower than the ground potential by a threshold voltage of the diode element.

* * * * *